(12) United States Patent
Hosokawa et al.

(10) Patent No.: US 7,579,930 B2
(45) Date of Patent: Aug. 25, 2009

(54) HIGH-FREQUENCY MODULE

(75) Inventors: Toshihiro Hosokawa, Yasu (JP); Kazuaki Higashibata, Fleet (GB); Tsuyoshi Suesada, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 28 days.

(21) Appl. No.: 11/844,490

(22) Filed: Aug. 24, 2007

(65) Prior Publication Data

US 2007/0296520 A1 Dec. 27, 2007

Related U.S. Application Data

(63) Continuation of application No. PCT/JP2006/302449, filed on Feb. 13, 2006.

(30) Foreign Application Priority Data

Apr. 18, 2005 (JP) .............................. 2005-120152

(51) Int. Cl.
*H01P 5/12* (2006.01)
(52) U.S. Cl. ..................... 333/134; 333/126; 333/129
(58) Field of Classification Search ......... 333/132–134, 333/193–196, 126, 129
See application file for complete search history.

(56) References Cited

U.S. PATENT DOCUMENTS 6,380,823 B1 * 4/2002 Ikata et al. .................. 333/133
7,245,882 B1 * 7/2007 McFarland .................... 455/73

FOREIGN PATENT DOCUMENTS

| JP | 10-150395 A | 6/1998 |
|---|---|---|
| JP | 2000-349586 A | 12/2000 |
| JP | 2001-119201 A | 4/2001 |
| JP | 2001-352272 A | 12/2001 |
| JP | 2002-64400 A | 2/2002 |
| JP | 2003-179464 A | 6/2003 |
| JP | 2003-179515 A | 6/2003 |

(Continued)

OTHER PUBLICATIONS

Official Communication for PCT Application No. PCT/JP2006/302449; mailed May 23, 2006.

(Continued)

*Primary Examiner*—Robert Pascal
*Assistant Examiner*—Kimberly E Glenn
(74) *Attorney, Agent, or Firm*—Keating & Bennett, LLP

(57) ABSTRACT

A high-frequency module is integrally formed from at least some circuit components defining a first wireless system using a first frequency band and at least some circuit components defining a second wireless system using a second frequency band. The high-frequency module includes a multilayer substrate including a plurality of stacked dielectric layers, a first terminal group disposed on a first surface of the multilayer substrate, where a plurality of terminals are arranged along a first side of four sides defining the first surface, and a second terminal group disposed on the first surface, where a plurality of terminals are arranged along a second side that is different from the first side. The first terminal group includes a first antenna terminal of the first wireless system whereas the second terminal group includes a second antenna terminal of the second wireless system.

6 Claims, 6 Drawing Sheets

| | FOREIGN PATENT DOCUMENTS | |
|---|---|---|
| JP | 2004-7756 A | 1/2004 |
| JP | 2004-199114 A | 7/2004 |
| JP | 2004-350068 A | 12/2004 |
| JP | 2006-014102 A | 1/2006 |

OTHER PUBLICATIONS

Official Communication in counterpart Japanese Application No. JP 2006-526474; mailed Dec. 19, 2006.

Official communication issued in counterpart Korean Application No. 10-2007-7022659, mailed on Jul. 21, 2008.

* cited by examiner

HIGH-FREQUENCY MODULE

BACKGROUND OF THE INVENTION

1. Field of the Invention

The present invention relates to a high-frequency module and, in particular, to a high-frequency module including a multilayer substrate having a resistor and a coil disposed therein.

2. Description of the Related Art

In recent years, wireless apparatuses, such as cell phones and wireless LANs (Local Area Networks) have become highly functional and the sizes of the wireless apparatuses have been decreased. Among such highly functional apparatuses, a wireless apparatus that can handle signals in a plurality of frequency bands has been developed. In order to decrease the size of the wireless apparatus that can handle signals in a plurality of frequency bands, a wireless module has been developed into which some of the parts of a wireless system, in particular, front-end parts are integrated as one package.

For example, Japanese Unexamined Patent Application Publication No. 2000-349586 describes an antenna duplexer that includes two duplexers and a connection terminal group for connecting the duplexers to external circuits. The connection terminal group includes an antenna terminal sub-group for connecting the duplexer to an external antenna and a transmission terminal sub-group and a reception terminal sub-group for connecting the duplexer to an external circuit. In this antenna duplexer, in a plane, an area in which the antenna terminal sub-group is disposed and an area in which the transmission terminal sub-group and the reception terminal sub-group are disposed are separated so as not to cross each other. The antenna duplexer includes an antenna terminal for an 800 MHz band and an antenna terminal for a 1.9 GHz band. The antenna terminal sub-groups are disposed close to each other in the vicinity of one side of a rectangular shape in plan view. It is described in Japanese Unexamined Patent Application Publication No. 2000-349586 that the size of this antenna duplexer which unifies two duplexers in one package can be decreased while maintaining an excellent frequency characteristic. Also, it is described that manufacturing of this antenna duplexer can be facilitated.

In the antenna duplexer described in Japanese Unexamined Patent Application Publication No. 2000-349586, two antenna terminals corresponding to two different frequency bands are disposed on the surface of the antenna duplexer along one side of the rectangular shape in a plane. In such an antenna duplexer, the physical distance between the two antenna terminals corresponding to different frequency bands is small, and therefore, the separation characteristics (isolation characteristics) between the two antenna terminals deteriorates. That is, crosstalk occurs between the antenna terminals and noise is induced.

Additionally, since the distance between a plurality of antenna terminals is small, the physical distance between wirings connected to the individual antenna terminals in the module substrate is small. Accordingly, the separation characteristics between the wirings in the module substrate deteriorate. Thus, crosstalk occurs between the wirings.

Furthermore, the wirings in the module substrate are arranged so as to extend in a direction perpendicular to a side of an area where the antenna terminals are formed. Accordingly, the directions in which the wirings connected to the individual antenna terminals extend are substantially parallel to each other. Thus, crosstalk between the wirings in the module substrate easily occurs.

Still furthermore, the above-described antenna duplexer is disposed on a surface of a module mounting substrate, such as a printed circuit board. The antenna terminals are connected to terminals formed on the module mounting substrate by means of, for example, solder. At that time, the physical distance between wirings formed on the surface of the module mounting substrate becomes small, and therefore, the separation characteristics deteriorate.

SUMMARY OF THE INVENTION

In order to overcome the problems described above, preferred embodiments of the present invention provide a high-frequency module including a plurality of antenna terminals and having excellent separation characteristics.

According to a preferred embodiment of the present invention, a high-frequency module is integrally formed from at least some circuit components defining a first wireless system using a first frequency band and at least some circuit components defining a second wireless system using a second frequency band. The high-frequency module includes a substrate having a substantially parallelepiped body and including at least one of an active component and a passive component among the circuit components, a first terminal group disposed on a first surface of the substrate, where the first terminal group includes a plurality of terminals arranged along a first side of four sides defining the first surface, and a second terminal group disposed on the first surface of the substrate, where the second terminal group includes a plurality of terminals arranged along a second side of the four sides forming the first surface. In the high-frequency module, the first terminal group includes a first antenna terminal of the first wireless system and the second terminal group includes a second antenna terminal of the second wireless system. With such a unique structure, a high-frequency module having an excellent separation characteristic is provided.

In the above-described preferred embodiment of the present invention, preferably, the substrate includes a multi-layer substrate having a substantially parallelepiped shape and including a plurality of stacked dielectric layers. With such a unique structure, the passive components serving as the circuit components can be three-dimensionally arranged inside the substrate, and therefore, a compact and high-density high-frequency module can be achieved.

In the above-described preferred embodiment of the present invention, preferably, the second terminal group is disposed along the second side immediately adjacent to the first side. With such a unique structure, the directions in which the wirings connected to the first and second antenna terminals extend are substantially perpendicular to each other. Accordingly, excellent separation characteristics between the wirings can be achieved.

In the above-described preferred embodiment of the present invention, preferably, the second antenna terminal is disposed closer to a third side facing the first side than to the first side in a direction in which the second side extends. With such a unique structure, the distance between the first antenna terminal and the second antenna terminal can be increased, and therefore, the separation characteristics can be improved.

In the above-described preferred embodiment of the present invention, preferably, a cavity is formed on the first surface between the first antenna terminal and the second antenna terminal. With such a unique structure, a layer different from the substrate, for example, an air layer can be disposed between the first antenna terminal and the second antenna terminal, and therefore, the separation characteristics can be further improved.

In the above-described preferred embodiment of the present invention, preferably, a ground terminal is preferably disposed on the first surface between the first antenna terminal and the second antenna terminal. With such a unique structure, a ground, namely, an electrode serving as an electromagnetic shield can be disposed between the first antenna terminal and the second antenna terminal, and therefore, the separation characteristics can be further improved.

In the above-described preferred embodiment of the present invention, preferably, a surface-mounted component defining one of the passive component and the active component is provided on a second surface opposite the first surface, and at least one of the first antenna terminal and the second antenna terminal is connected to the surface-mounted component disposed on the surface of the multilayer substrate via a via hole conductor passing through the multilayer substrate in a direction of stacking the dielectric layers virtually without using an in-plane conductor extending perpendicular to the direction of stacking of the dielectric layers. With such a unique structure, the wirings connected to the first antenna terminal and the second antenna terminal need not be disposed inside the multilayer substrate, and therefore, the separation characteristics can be further improved.

Accordingly, preferred embodiments of the present invention provide a high-frequency module including a plurality of antenna terminals and having excellent separation characteristics.

Other features, elements, steps, characteristics and advantages of the present invention will be described below with reference to preferred embodiments thereof and the attached drawings.

DETAILED DESCRIPTION OF PREFERRED EMBODIMENTS

First Preferred Embodiment

A high-frequency module according to a first preferred embodiment of the present invention is described below with reference to FIGS. 1 to 14.

Figure 1:
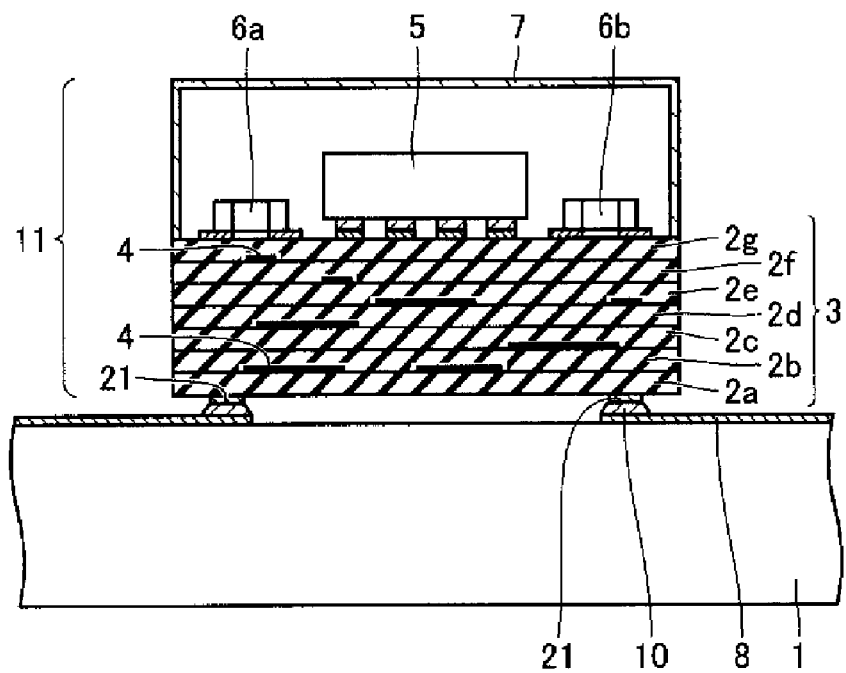
FIG. 1 is a schematic illustration showing a cross sectional view of a first high-frequency module and a printed circuit board according to a first preferred embodiment of the present invention.
Figure 2:
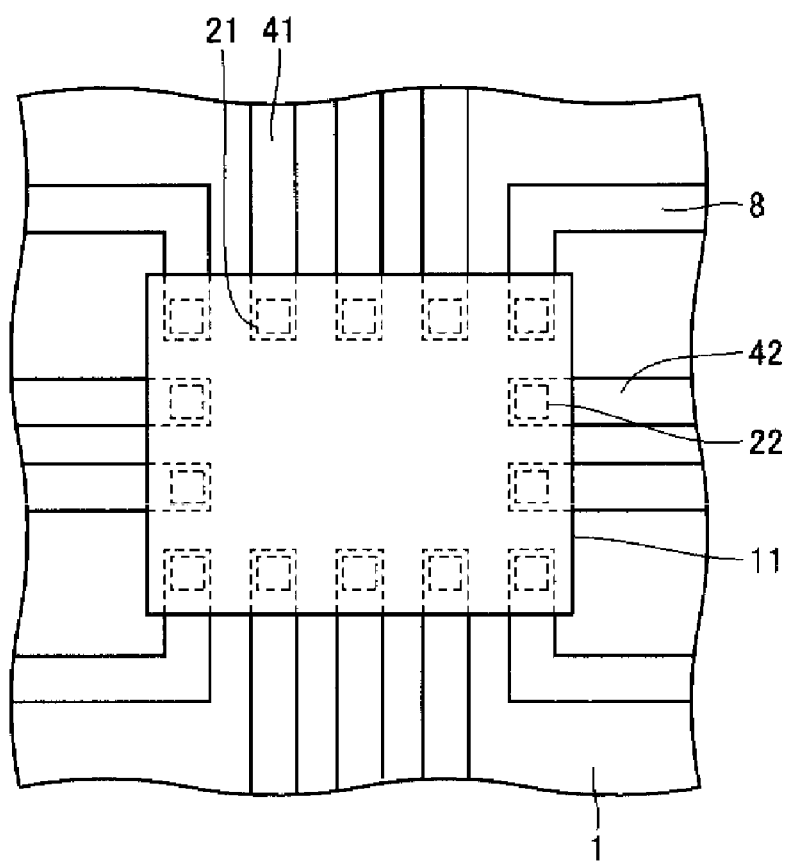
FIG. 2 is a schematic illustration showing a plan view of the first high-frequency module according to the first preferred embodiment of the present invention.

FIG. 1 is a schematic illustration of a cross sectional view of the high-frequency module according to the present preferred embodiment when mounted on a module mounting substrate. FIG. 2 is a schematic illustration showing a plan view of the high-frequency module when mounted on the module mounting substrate. As shown in FIGS. 1 and 2, a plurality of terminals disposed on a first surface of a high-frequency module 11 are electrically connected to the upper surface of an wiring electrode 8 disposed on a surface of a printed circuit board 1 defining a module mounting substrate via a connecting material, such as a solder 10, for example. Thus, the high-frequency module 11 is provided.

The high-frequency module 11 includes a multilayer substrate 3 defining a body. The multilayer substrate 3 includes stacked dielectric layers 2a to 2g. Each of the dielectric layers 2a to 2g includes passive components, such as a resistor, a capacitor, and a coil, as internal components 4. The internal components 4 are formed on a surface of each of the dielectric layers 2a to 2g and are arranged on the surface of each of the dielectric layers 2a to 2g. The internal components 4 are preferably defined by in-plane conductors extending perpendicular or substantially perpendicular to the direction of the stack of the layers. The internal components 4 formed on the surfaces of the dielectric layers 2a to 2g are electrically connected to each other via interlayer connection conductors (via hole conductors) formed through the dielectric layers 2a to 2g. The multilayer substrate 3 is preferably formed from a plurality of stacked dielectric ceramic layers. However, the multilayer substrate 3 may be formed from a plurality of stacked resin layers. In addition, the multilayer substrate 3 may include a magnetic material layer. Furthermore, the multilayer substrate 3 may be a single-layered substrate formed from ceramic or resin.

In particular, the multilayer substrate 3 is preferably a ceramic multilayer substrate including stacked dielectric ceramic layers, each of which is preferably formed from a low temperature co-fired ceramic (LTCC) material by firing. As used herein, the low temperature co-fired ceramic material refers to a ceramic material that can be fired at a temperature less than or equal to about 1,050° C. and that can be fired together with silver and copper having a low specific resistance. More specifically, examples of the low temperature co-fired ceramic material include a glass-composite based LTCC material in which a borosilicate glass is mixed with ceramic powders, such as alumina or forsterite powders, a crystalline-glass based LTCC material using $ZnO$—$MgO$—$AL_2O_3$—$SiO_2$ crystalline glass, and a non-glass based LTCC material using $BaO$—$Al_2O_3$—$SiO_2$ ceramic powders or $Al_2O_3$—$CaO$—$SiO_2$—$MgO$—$B_2O_3$ ceramic powders. By using the low temperature co-fired ceramic material as a material for the multilayer substrate 3, a low-melting metallic material having a low resistance, such as silver and copper, can be used for a material of an in-plane conductor and a via hole conductor that are fired at the same time as the ceramic material. Thus, the multilayer substrate 3, the in-plane conductor, and the via hole conductor can be fired at the same time at a relatively low temperature less than or equal to about 1,050° C.

The multilayer substrate 3 includes the stacked dielectric layers 2a to 2g preferably having a substantially parallelepiped shape. Surface-mounted components are mounted on a second surface, which is one of the main surfaces of the multilayer substrate 3. The first surface is adjacent to the printed circuit board 1 and the second surface is opposite the first surface. In this preferred embodiment, external elements 5, 6a, and 6b are disposed on the surface. Each of the external elements 5, 6a, and 6b is connected and secured to a terminal disposed on the second surface of the multilayer substrate 3 via solder or a conductive adhesive agent. In this preferred embodiment, a passive component, such as a resistor, a coil, or a capacitor, is disposed as the external element 6a or 6b. Additionally, an active component, such as an IC (integrated circuit) chip, is disposed as the external element 5.

According to this preferred embodiment, the high-frequency module includes an outer case 7 secured to the multilayer substrate 3. The outer case 7 preferably has box shape and is arranged to cover the external elements 5, 6a, and 6b. A plurality of terminals 21 defining electrode pads disposed on the first surface of the multilayer substrate 3 which faces the printed circuit board 1. In this preferred embodiment, the terminals 21 are produced in the form of films. The terminals 21 are connected to the wiring electrodes 8 disposed on the surface of the printed circuit board 1 via the solder 10.

As shown in FIG. 2, according to this preferred embodiment, the wiring electrodes 8 are disposed on the surface of the printed circuit board 1 so as to substantially radially extend from the high-frequency module 11. The wiring electrodes 8 are preferably in the form of a film made from, for example, a metallic foil on the surface of the printed circuit board 1.

Figure 3:
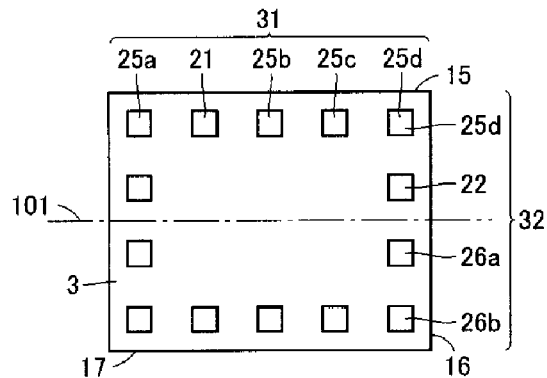
FIG. 3 is a bottom view of the high-frequency module according to the first preferred embodiment of the present invention.

FIG. 3 is a bottom view of the high-frequency module according to this preferred embodiment. A first terminal group 31 and a second terminal group 32 used for electrical connection with the printed circuit board are disposed on the first surface of the multilayer substrate 3 that faces the printed circuit board 1. In this preferred embodiment, the terminals are arranged along the outer peripheral edges of the bottom surface of the multilayer substrate 3. The first terminal group 31 includes the terminal 21 and terminals 25a to 25d. The second terminal group 32 includes terminals 22, 25d, 26a, and 26b. In addition, in this preferred embodiment, the bottom surface of the high-frequency module preferably has a substantially quadrangular shape and, more particularly, preferably has a substantially rectangular shape with four sides, namely, a first side 15, a second side 16 adjacent to the first side, a third side 17 facing the first side, and a fourth side facing the second side.

The first terminal group 31 includes a plurality of the terminals arranged substantially in a line along the first side 15, which is one of the four sides forming the substantially rectangular bottom surface, namely, the first surface of the multilayer substrate 3. That is, the terminal 21 and the terminals 25a to 25d are arranged substantially parallel to the first side 15. Additionally, the terminal 21 and the terminals 25a to 25d are arranged in the vicinity of the outer peripheral edge of the multilayer substrate 3 with a slight gap from the outer peripheral edge.

The second terminal group 32 includes a plurality of the terminals arranged substantially in a line along the second side 16, which is one of the four sides defining the substantially rectangular bottom surface, namely, the first surface of the multilayer substrate 3. That is, the terminals 22, 25d, 26a, and 26b are arranged substantially parallel to the second side 16. Additionally, the terminals 22, 25d, 26a, and 26b are arranged in the vicinity of the outer peripheral edge of the multilayer substrate 3 with a slight gap from the outer peripheral edge. Thus, an imaginary line passing through the centers of the terminals of the second terminal group 32 is substantially perpendicular to an imaginary line passing through the centers of the terminals of the first terminal group 31.

In this preferred embodiment, each of the terminals 21, 22, 25a-25d, 26a, and 26b preferably has a substantially rectangular shape in plan view. Each of the terminals 21, 22, 25a-25d, 26a, and 26b is preferably produced in the form of a film. Each of the terminals 21, 22, 25a-25d, 26a, and 26b is electrically connected to one of the internal components 4 disposed inside the multilayer substrate 3 or one of the external elements 5, 6a, and 6b located outside the multilayer substrate 3 (see FIG. 1). The shape of the terminal electrode may be substantially rectangular, substantially square, or substantially circular in plan view. In addition, the terminals may be formed from metallic films, as noted above. Alternatively, the exposed surfaces of the via hole conductors provided in the multilayer substrate 3 may be used as the terminals.

According to this preferred embodiment, the high-frequency module includes part of a first wireless system that uses signals in a first frequency band and part of a second wireless system that uses signals in a second frequency band in an integrated fashion.

Figure 5:
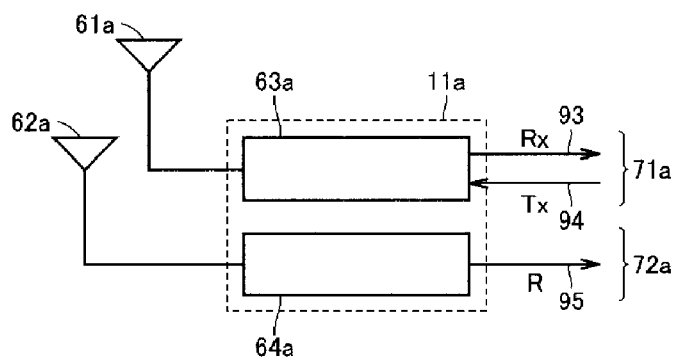
FIG. 5 is a schematic illustration of the configuration of a first wireless system according to the first preferred embodiment of the present invention.

FIG. 5 is a schematic illustration of the configuration of the wireless system according to this preferred embodiment. In this preferred embodiment, a first wireless system 71a preferably is a BlueTooth® wireless system. The second wireless system 72a preferably is an FM radio.

The first wireless system 71a includes a first antenna 61a and a first front-end unit 63a connected to the first antenna 61a. The second wireless system 72a includes a second antenna 62a and a second front-end unit 64a connected to the second antenna 62a. In this preferred embodiment, each of the wireless systems may include an arithmetic processing unit and a memory unit in addition to the front-end unit in order to process a high-frequency signal. The front-end unit, a signal computing unit, and the memory unit are formed from positive components (such as capacitors and inductors) and active components (such as IC chips).

As shown by arrows 93 and 94, the first wireless system 71a sends and receives a signal in the first frequency band using the first antenna 61a and the first front-end unit 63a. Additionally, as shown by arrow 95, the second wireless system 72a receives a signal in the second frequency band using the second antenna 62a and the second front-end unit 64a.

As shown in FIG. 5, a high-frequency module 11a includes the first front-end unit 63a and the second front-end unit 64a. As noted above, the high-frequency module according to this preferred embodiment can transmit or receive signals in two different frequency bands.

As shown in FIG. 3, according to this preferred embodiment, the first terminal group 31 includes the first antenna terminal 21 of the first wireless system. The first antenna terminal 21 is connected to the first antenna 61a. The second terminal group 32 includes the second antenna terminal 22 of the second wireless system. The second antenna terminal 22 is connected to the second antenna 62a.

In this preferred embodiment, the first antenna terminal 21 and the second antenna terminal 22 are disposed in the vicinity of the outer periphery of the first surface and near the different sides of the first surface. In this preferred embodiment, the bottom surface of the multilayer substrate preferably is substantially rectangular. The first antenna terminal 21 is disposed in the vicinity of the first side 15 of this substantially rectangular shape. The second antenna terminal 22 is located in the vicinity of the second side 16 adjacent to the first side 15.

Additionally, according to this preferred embodiment, the second antenna terminal 22 is disposed closer to the third side 17 than to the first side 15 on which the first antenna terminal 21 is disposed in the direction in which the second side 16 extends. That is, when a center line 101 of the second side 16 delimits the first surface into two areas, the antenna terminal 22 is located in an area where the first antenna terminal 21 is not located. In FIG. 3, when the center line 101 evenly divides the bottom surface of the multilayer substrate 3 into two areas, the first antenna terminal 21 is disposed in the upper area and the second antenna terminal 22 is disposed in the lower area.

Figure 4:
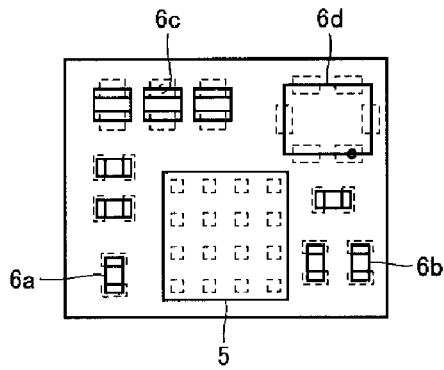
FIG. 4 is a schematic illustration showing a plan view of the high-frequency module according to the first preferred embodiment of the present invention when an outer case thereof is removed.

FIG. 4 is a schematic illustration showing a plan view of the high-frequency module according to this preferred embodiment when the outer case is removed. The external elements 5 and 6a-6d are disposed on the surface of the multilayer substrate 3.

FIGS. 6 to 12 schematically illustrate plan views of the individual dielectric layers of the multilayer substrate. As shown in FIG. 1, the multilayer substrate 3 includes the dielectric layer 2a, a dielectric layer 2b, and a dielectric layer 2c stacked in this order from the side adjacent to the printed circuit board 1.

Figure 6:
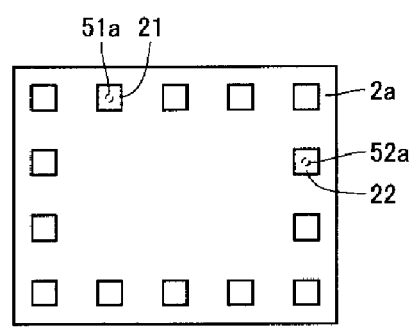
FIG. 6 is a perspective view of a first dielectric layer according to the first preferred embodiment of the present invention.
Figure 7:
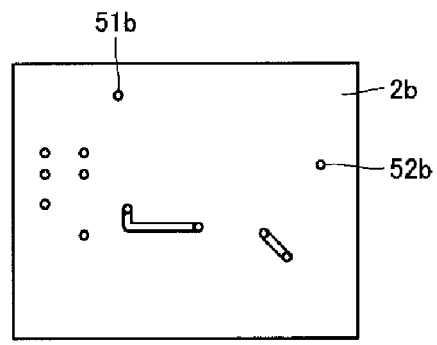
FIG. 7 is a plan view of a second dielectric layer according to the first preferred embodiment of the present invention.
Figure 8:
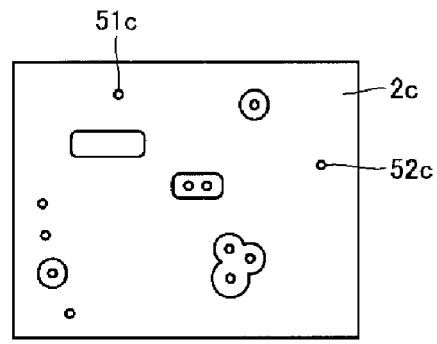
FIG. 8 is a plan view of a third dielectric layer according to the first preferred embodiment of the present invention.
Figure 9:
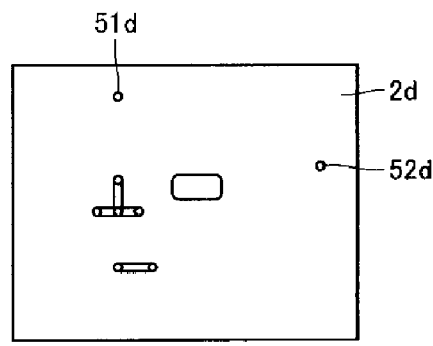
FIG. 9 is a schematic illustration showing a plan view of a fourth dielectric layer according to the first preferred embodiment of the present invention.
Figure 10:
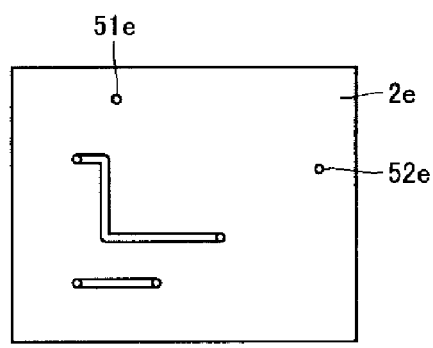
FIG. 10 is a schematic illustration showing a plan view of a fifth dielectric layer according to the first preferred embodiment of the present invention.
Figure 11:
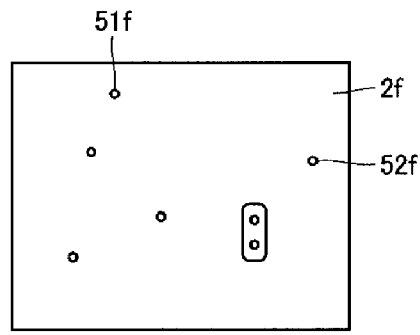
FIG. 11 is a schematic illustration showing a plan view of a sixth dielectric layer according to the first preferred embodiment of the present invention.
Figure 12:
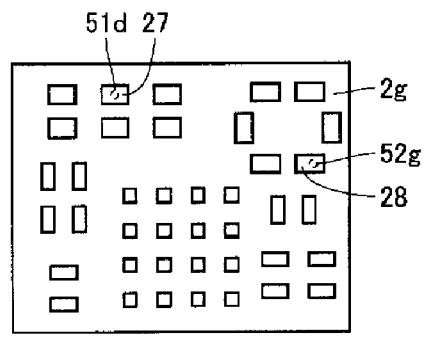
FIG. 12 is a schematic illustration showing a plan view of a seventh dielectric layer according to the first preferred embodiment of the present invention.

FIG. 6 is a perspective view of the dielectric layer 2a, viewed from the top. The first antenna terminal 21 and the second antenna terminal 22 are disposed on the surface of the dielectric layer 2a. A via hole conductor 51a is formed at a position where the first antenna terminal 21 is disposed so as to pass through the dielectric layer 2a. Additionally, a via hole conductor 52a is formed at a position where the second antenna terminal 22 is disposed so as to pass through the dielectric layer 2a.

FIGS. 7 to 12 are plan views of the individual dielectric layers included in the multilayer substrate. In this preferred embodiment, in-plane conductors and via hole conductors that define passive components are formed on a surface of each of the dielectric layers 2b to 2g. Via-hole conductors 51b to 51g that pass through the dielectric layers 2b to 2g, respectively, are formed directly above the first antenna terminal 21. In addition, via hole conductors 52b to 52g that pass through the dielectric layers 2b to 2g, respectively, are formed directly above the second antenna terminal 22. Each of the via hole conductors 51a to 51g and 52a to 52g is preferably formed from a conductive resin or metal.

As shown in FIGS. 6 through 12, the via hole conductors 51a to 51g and 52a to 52g pass through the corresponding dielectric layers so that the terminals 21 and 22 (see FIG. 6) disposed on the bottom surface of the multilayer substrate are electrically connected to terminals 27 and 28 (see FIG. 12) disposed on the top surface of the multilayer substrate.

The first antenna terminal 21 is electrically connected to surface-mounted components on the surface of the multilayer substrate via the via hole conductors 51a to 51g that pass through the multilayer substrate and that are connected to each other virtually without using the in-plane conductors. The in-plane conductor is formed in a line on the surface of each dielectric layer. This in-plane conductor may be electrically connected to another passive component. That is, in some cases, the first antenna terminal 21 is connected to a surface-mounted component disposed on the surface of the multilayer substrate via the in-plane conductor extending parallel or substantially parallel to the main surface of the dielectric layer.

However, the first antenna terminal 21 according to this preferred embodiment is connected to the surface-mounted component mounted on the surface of the multilayer substrate remote from the first antenna terminal 21 virtually using only the via hole conductors 51a to 51g. Similarly, the second antenna terminal 22 according to this preferred embodiment is connected to the surface-mounted component mounted on the surface of the multilayer substrate remote from the second antenna terminal 22 virtually using only the via hole conductors 52a to 52g. That is, each of the antenna terminals is wired in the multilayer substrate without using the in-plane conductors that are parallel to each other on the surface of the same dielectric layer.

In this preferred embodiment, a high-frequency module includes a first terminal group and a second terminal group. The first terminal group is disposed on a first surface of a substantially parallelepiped multilayer substrate and includes a plurality of terminals arranged along a first side of four sides defining the first surface. The second terminal group includes a plurality of terminals arranged along a second side of the four sides that is different from the first side. The first terminal group includes a first antenna terminal of a first wireless system whereas the second terminal group includes a second antenna terminal of a second wireless system. In such a structure, the distance between the first antenna terminal and the second antenna terminal is greatly increased. Furthermore, wiring electrodes disposed on a printed circuit board can be configured so that wiring electrodes connected to the first antenna terminal are not parallel to wiring electrodes connected to the second antenna terminal and are not adjacent to the wiring electrodes connected to the second antenna terminal. Accordingly, interference between signals propagating through each antenna terminal and each wiring terminal via an electromagnetic field can be reduced. As a result, the isolation characteristics (separation characteristics) of the signal propagating through each antenna terminal can be improved.

In addition, according to this preferred embodiment, the second terminal group is arranged along the second side that is adjacent to the first side in plan view. In such a structure, directions in which wiring lines disposed in the multilayer substrate and wiring electrodes disposed on a surface of a module mounting substrate extend are not substantially parallel to each other in the vicinity of each antenna terminal. Accordingly, the occurrence of electromagnetic coupling between in-plane conductors disposed inside the multilayer substrate or between the wiring electrodes on the module mounting substrate is reduced. As a result, the separation characteristics can be further improved.

For example, as shown in FIG. 2, when the high-frequency module 11 is disposed on the printed circuit board 1, the wiring electrodes 8 connected to the high-frequency module 11 are arranged so as to radially and outwardly extend from the high-frequency module 11. Since the first antenna terminal 21 and the second antenna terminal 22 are disposed on different adjacent sides, respectively, in the high-frequency module according to this preferred embodiment, a direction in which a first antenna wiring 41 extends is not substantially parallel to a direction in which a second antenna wiring 42 extends. Thus, crosstalk between the first antenna wiring 41 and the second antenna wiring 42 can be reduced, and therefore, the separation characteristics can be improved.

Furthermore, in this preferred embodiment, the second antenna terminal is disposed so as to be closer to a third side that faces the first side than to the first side in a direction in which the second side extends. In such a structure, the distance between the first antenna terminal 21 and the second antenna terminal 22, and therefore, the distance between the wiring electrode disposed on the printed circuit board and connected to the first antenna terminal and the wiring electrode disposed on the printed circuit board and connected to the second antenna terminal can be further increased. Accordingly, another terminal can be easily disposed between the antenna terminals, thereby further increasing the separation characteristics.

Still furthermore, in this preferred embodiment, each of the first antenna terminal and the second antenna terminal is connected to the surface-mounted component disposed on the surface of the multilayer substrate using via hole conductors passing through the multilayer substrate virtually without using in-plane conductors. In such a structure, the in-plane conductors disposed on the surfaces of the dielectric layers inside the multilayer substrate can be arranged so that the directions in which these in-plane conductors extend are not substantially parallel to each other. Thus, crosstalk inside the multilayer substrate can be reduced. As a result, the separation characteristics can be further improved.

In this preferred embodiment, each of the first antenna terminal and the second antenna terminal is connected to the surface-mounted components disposed on a surface of the multilayer substrate using only via hole conductors. However, preferred embodiments of the present invention are not limited thereto. At least one of the first antenna terminal and the second antenna terminal can be connected to the surface-mounted components disposed on the surface of the multilayer substrate virtually using only via hole conductors passing through the multilayer substrate. As used herein, the term "virtually" means that in-plane conductors disposed on the dielectric layers inside the multilayer substrate are allowed to extend from the via hole conductors so as to have such lengths that do not generate a crosstalk.

Additionally, in this preferred embodiment, the first wireless system preferably is a BlueTooth® (frequency: 2402-2480 MHz) system and the second wireless system preferably is an FM radio (frequency: 76-108 MHz) system. However, preferred embodiments of the present invention are not limited thereto. The present invention can be applied to any systems using different frequency bands.

For example, the present invention can be applied to a high-frequency module into which parts of any two of the following systems are integrated: the 802.11b/g (frequency: 2400-2483.5 MHz) system used for a wireless LAN, a CDMA (frequency: 800 MHz band) system, a GSM (frequency: 800 MHz band, 900 MHz band, 1.8 GHz band, or 1.9 GHz band) system, a PDC (800 MHz or 1.5 GHz) system, and a Felica® (frequency: 13.56 MHz) system. Furthermore, in this preferred embodiment, parts of two wireless systems are preferably integrated into a high-frequency module. However, the present invention is not limited thereto. The present invention can be applied to a high-frequency module into which three or more systems are integrated.

Figure 13:
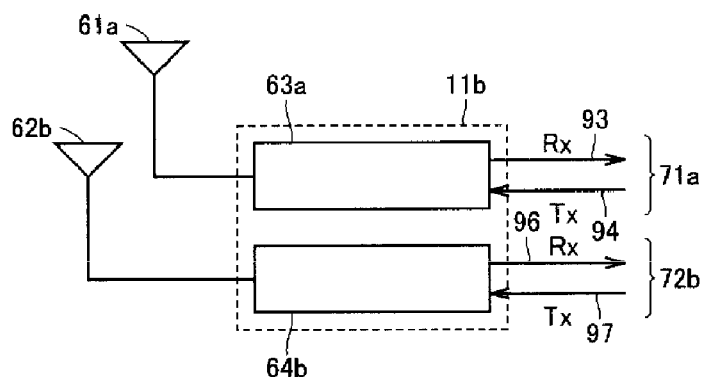
FIG. 13 is a schematic illustration of the configuration of a second wireless system according to the first preferred embodiment of the present invention.

FIG. 13 is a schematic illustration of another wireless system according to a present preferred embodiment of the present invention. As shown in FIG. 13, a BlueTooth® system preferably defines the first wireless system 71a whereas a W-LAN system preferably defines a second wireless system 72b. The second wireless system 72b includes a second front-end unit 64b and a second antenna 62b. A high-frequency module 11b includes the first front-end unit 63a and the second front-end unit 64b. The second wireless system 72b can not only receive a signal, as shown by arrow 96, but also transmit a signal, as shown by arrow 97. That is, each of the two wireless systems can transmit and receive a signal.

Although, in the present preferred embodiment, the terminals disposed on the multilayer substrate have been shown and described with reference to terminals isolated on the first surface of the multilayer substrate (such as electrode pads), terminals that communicate with each other along the side surface of the multilayer substrate can be used. That is, according to the present invention, the terminals including an antenna terminal may be foldback terminal electrodes in addition to land grid array (LGA) terminal electrodes.

Figure 14:
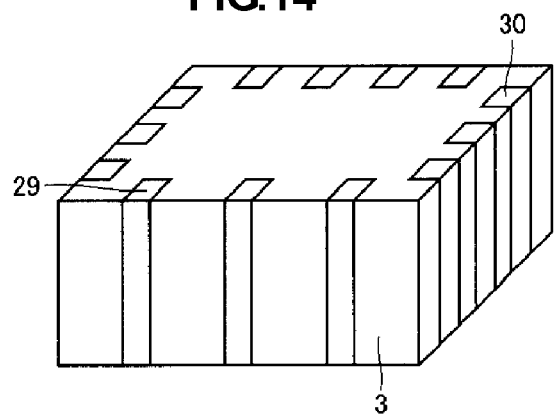
FIG. 14 is a schematic illustration showing a perspective view of a second high-frequency module according to the first preferred embodiment of the present invention.

FIG. 14 is a schematic illustration showing a perspective view of another type of high-frequency module according to a preferred embodiment of the present invention. This high-frequency module includes foldback terminals 29 and 30. Each of the foldback terminals 29 and 30 is arranged so as to extend upward from a side surface of the multilayer substrate 3. As noted above, the terminal may extend across two or more surfaces of the multilayer substrate.

Second Preferred Embodiment

A high-frequency module according to a second preferred embodiment of the present invention is described below with reference to FIGS. 15 and 16.

Figure 15:
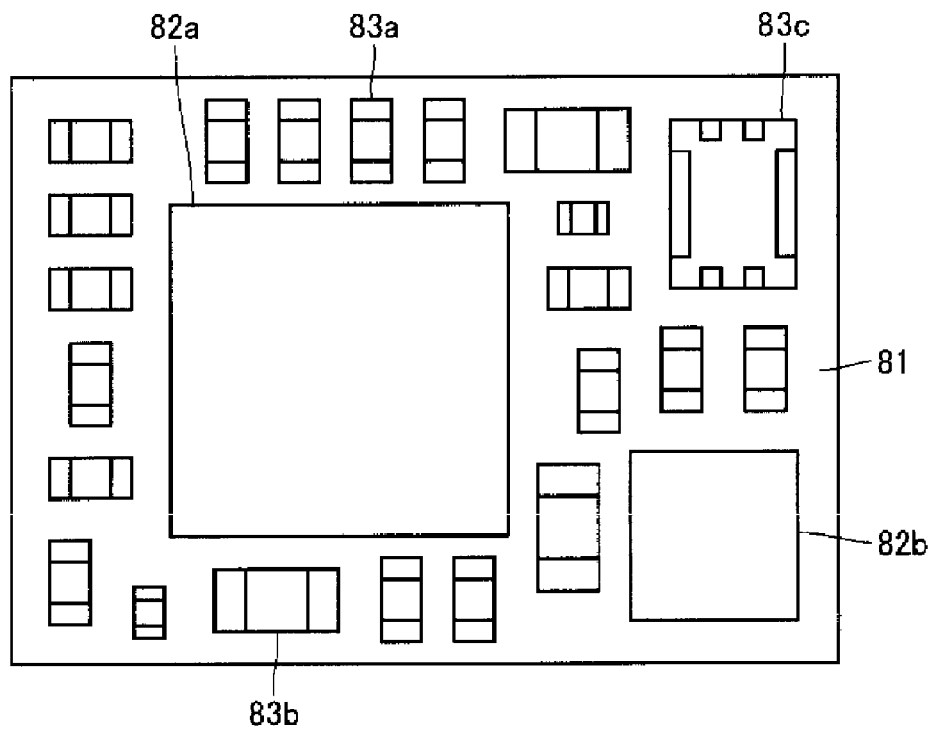
FIG. 15 is a schematic illustration showing a plan view of a high-frequency module according to a second preferred embodiment of the present invention when an outer case thereof is removed.
Figure 16:
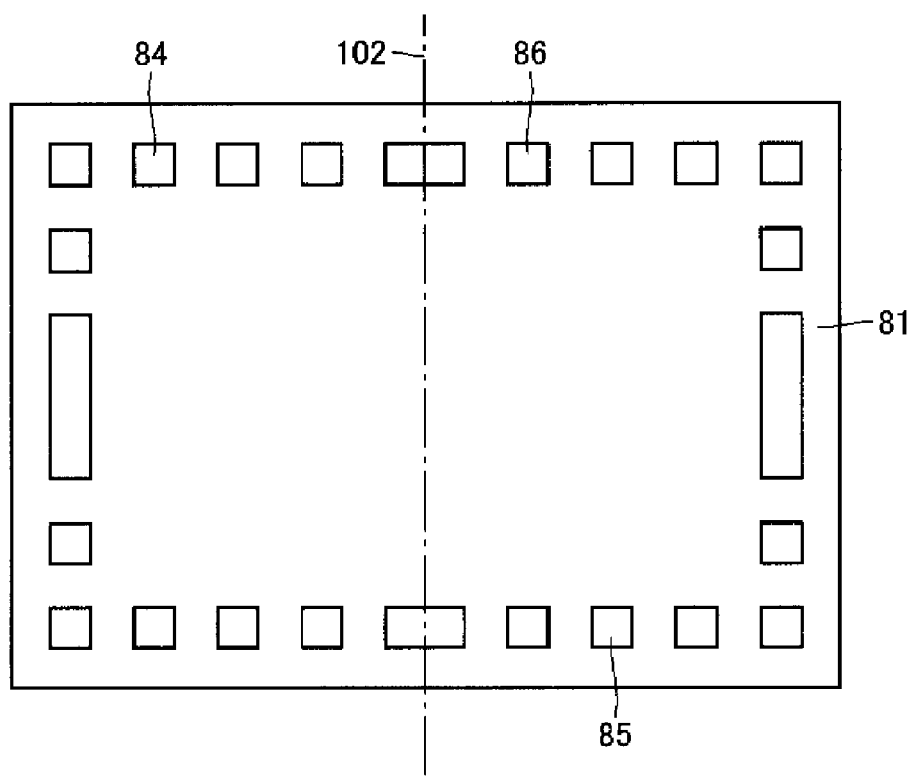
FIG. 16 is a schematic illustration showing a bottom view of the high-frequency module according to the second preferred embodiment of the present invention.

FIG. 15 is a plan view of the high-frequency module according to the present preferred embodiment when an upper cover thereof is removed. FIG. 16 is a bottom view of the high-frequency module according to the present preferred embodiment. According to the present preferred embodiment, the high-frequency module includes a multilayer substrate 81. Two IC chips 82a and 82b and external elements 83a to 83c (such as a stacked capacitor or a stacked inductor) are disposed on the surface of the multilayer substrate 81 remote from a module mounting substrate that is connected to the multilayer substrate 81.

A plurality of terminals 86 are disposed on the bottom surface of the multilayer substrate 81. The plurality of terminals 86 include a first antenna terminal 84 and a second antenna terminal 85. The multilayer substrate 81 preferably has a substantially rectangular shape when viewed from the bottom thereof. The first antenna terminal 84 is located in the vicinity of one of the four sides of the substantially rectangular shape whereas the second antenna terminal 85 is located in the vicinity of a side facing that side. A center line 102 is a perpendicular bisector of the side with the first antenna terminal 84 being located in the vicinity thereof.

In the present preferred embodiment, the first antenna terminal 84 is located in one area formed by the center line 102 whereas the second antenna terminal 85 is located in the other area formed by the center line 102. That is, the first antenna terminal 84 is located in the vicinity of one corner whereas the second antenna terminal 85 is located in the vicinity of a corner opposite that corner. In such a structure, the distance between the first antenna terminal 84 and the second antenna terminal 85 can be increased, thereby improving the separation characteristics.

The other structures, operations, and features are the same as those of the first preferred embodiment, and therefore, descriptions are not repeated.

Third Preferred Embodiment

A high-frequency module according to a third preferred embodiment of the present invention is described below with reference to FIGS. 17 and 18.

Figure 17:
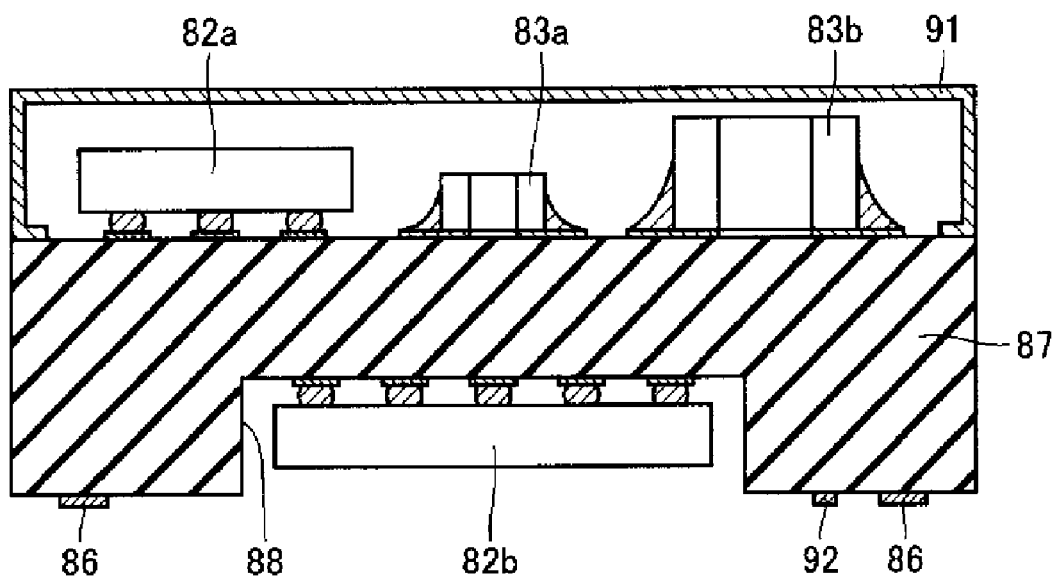
FIG. 17 is a schematic illustration showing a cross-sectional view of a high-frequency module according to a third preferred embodiment of the present invention.

FIG. 17 is a schematic illustration showing a cross-sectional view of the high-frequency module according to the present preferred embodiment. FIG. 18 is a bottom view of the high-frequency module according to the present preferred embodiment.

According to the present preferred embodiment, the high-frequency module includes a multilayer substrate 87 and external elements 82*a*, 83*a*, and 83*b* disposed on a surface of the multilayer substrate 87. The external element 82*a* is an active component (such as an IC chip). The external elements 83*a* and 83*b* are passive components (such as stacked capacitors). Additionally, the high-frequency module according to this preferred embodiment includes an outer case 91 that is arranged so as to cover the external elements 82*a*, 83*a*, and 83*b*.

According to the present preferred embodiment, a cavity 88 is formed on a first surface of the multilayer substrate 87 facing the module mounting substrate. The external element 82*b* is disposed inside the cavity 88. Here, the external element 82*b* is an IC chip. The external element 82*b* is connected and secured to terminals formed on a surface of the multilayer substrate 87 by solder. The external element 82*b* is electrically connected to an internal component (not shown) disposed inside the multilayer substrate 87.

Figure 18:
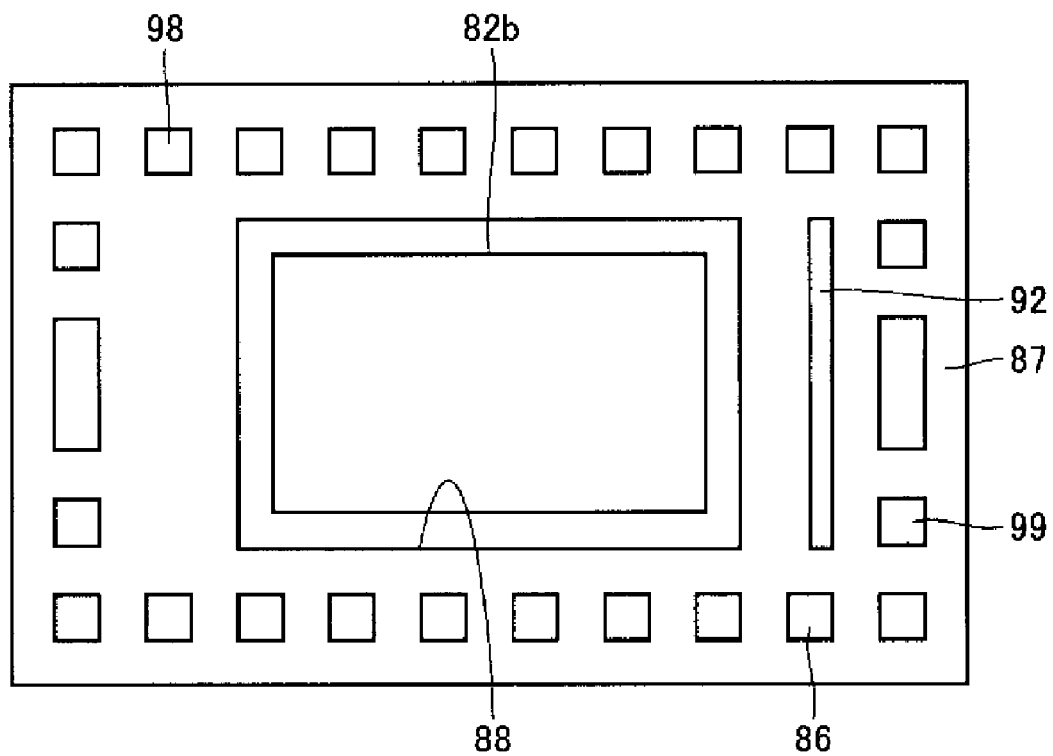
FIG. 18 is a schematic illustration showing a bottom view of the high-frequency module according to the third preferred embodiment of the present invention.

As shown in FIG. 18, the surface of the multilayer substrate 87 facing the printed circuit board preferably has a substantially rectangular shape. A plurality of terminals 86 are formed on that surface and are grouped into terminal groups. Each of the terminal groups is disposed along a side of the substantially rectangular shape. A first antenna terminal 98 among the terminals 86 is included in a first wireless system. A second antenna terminal 99 among the terminals 86 is included in a second wireless system. The first antenna terminal 98 and the second antenna terminal 99 are disposed in the vicinities of different sides of the rectangular shape.

In the present preferred embodiment, the cavity 88 is formed between the first antenna terminal 98 and the second antenna terminal 99. The cavity 88 is formed so as to be concavely curved from the surface of the multilayer substrate 87. The cavity 88 is located substantially in the middle of the bottom surface of the multilayer substrate 87 and has a substantially rectangular shape in plan view. In addition, the cavity 88 is formed so as to extend over an imaginary line between the first antenna terminal 98 and the second antenna terminal 99.

Furthermore, according to the present preferred embodiment, a ground terminal 92 is disposed along a side of the cavity 88. The ground terminal 92 is arranged so as to have a line shape in plan view. The ground terminal 92 is connected to ground. Unlike the antenna terminals, the ground terminal 92 preferably has a line shape that is not parallel to the imaginary line between the first antenna terminal 98 and the second antenna terminal 99. The ground terminal 92 is arranged so as to extend over the imaginary line between the first antenna terminal 98 and the second antenna terminal 99.

Since the cavity is formed between the first antenna terminal and the second antenna terminal, as noted above, an air layer can be formed between the first antenna terminal and the second antenna terminal. Accordingly, the separation characteristics can be further improved. In addition, since the ground terminal is disposed between the first antenna terminal and the second antenna terminal, the separation characteristics can be improved. Note that the cavity and the ground terminal do not necessarily have to be disposed over the line between the antenna terminals. It is only required that the cavity and the ground terminal shield at least part of the electromagnetic fields generated around the antenna terminals.

The other structures, operations, and features are the same as those of the first preferred embodiment, and therefore, descriptions are not repeated.

It should be noted that similar reference numerals are used for the same or similar components in the drawings in relation to the above-described preferred embodiments.

It should be clearly understood that the preferred embodiments described above are illustrative only and are not intended to limit the scope of the present invention. The scope of the invention should be determined in view of the following claims. Accordingly, many equivalents to the specific preferred embodiments of the invention described herein are intended to be encompassed in the scope of the present invention.

What is claimed is:

1. A high-frequency module integrally comprising:
   at least some circuit components defining a first wireless system using a first frequency band and at least some circuit components defining a second wireless system using a second frequency band;
   a substrate including at least one of an active component and a passive component of the at least some circuit components of the first and second wireless systems;
   a first terminal group disposed on a first surface of the substrate, the first terminal group including a plurality of terminals arranged along a first side of four sides defining the first surface; and
   a second terminal group disposed on the first surface of the substrate, the second terminal group including a plurality of terminals arranged along a second side of the four sides defining the first surface; wherein
   the first terminal group includes a first antenna terminal of the first wireless system and the second terminal group includes a second antenna terminal of the second wireless system; and
   the first side of the four sides defining the first surface is adjacent to and extends substantially perpendicularly to the second side of the four sides defining the first surface.

2. The high-frequency module according to claim 1, wherein the substrate includes a multilayer substrate having a substantially parallelepiped shape and including a plurality of stacked dielectric layers.

3. The high-frequency module according to claim 2, wherein a surface-mounted component defining one of the passive component and the active component is disposed on a second surface opposite the first surface, and at least one of the first antenna terminal and the second antenna terminal is connected to the surface-mounted component disposed on the surface of the multilayer substrate through a via hole conductor passing through the multilayer substrate in a direction of stacking the dielectric layers virtually without using an in-plane conductor extending perpendicular to the direction of stacking the dielectric layers.

4. The high-frequency module according to claim 1, wherein the second antenna terminal is disposed closer to a third side facing the first side than to the first side in a direction in which the second side extends.

5. The high-frequency module according to claim 1, wherein a cavity is formed on the first surface between the first antenna terminal and the second antenna terminal.

6. The high-frequency module according to claim 1, wherein a ground terminal is disposed on the first surface between the first antenna terminal and the second antenna terminal.

* * * * *